(12) United States Patent
Hirata

(10) Patent No.: US 6,899,557 B2
(45) Date of Patent: May 31, 2005

(54) DETECTION SWITCH MOUNTED IN A CARD SOCKET

(75) Inventor: Toshihisa Hirata, Yamato (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 10/472,284
(22) PCT Filed: Apr. 23, 2002
(86) PCT No.: PCT/US02/12766
§ 371 (c)(1), (2), (4) Date: Sep. 17, 2003
(87) PCT Pub. No.: WO02/087298
PCT Pub. Date: Oct. 31, 2002

(65) Prior Publication Data
US 2004/0104104 A1 Jun. 3, 2004

(30) Foreign Application Priority Data

Apr. 23, 2001 (JP) .......................................... 2001/123877
Aug. 7, 2001 (JP) .......................................... 2001/239471

(51) Int. Cl.$^7$ .............................................. H01R 29/00
(52) U.S. Cl. ...................................................... 439/188
(58) Field of Search ................................. 439/188, 360, 439/635, 637; 200/50.01, 51.1

(56) References Cited

U.S. PATENT DOCUMENTS

| | | | | |
|---|---|---|---|---|
| 6,425,775 B1 | * | 7/2002 | Chang et al. | 439/188 |
| 6,488,528 B2 | * | 12/2002 | Nishioka | 439/489 |
| 6,514,094 B1 | * | 2/2003 | Reichle | 439/188 |
| 6,592,385 B1 | * | 7/2003 | Chen | 439/159 |

* cited by examiner

Primary Examiner—Thanh-Tam Le
(74) Attorney, Agent, or Firm—Stacey E. Caldwell

(57) ABSTRACT

A detection switch mounted in a card socket including contact members responsive to insertion of a card into the card socket. The switch includes two or more contact members of the same design, each contact member having a switch contact formed on opposite ends. The switch contact at one end has a front contact section formed in the card width-parallel plane defining a first switch contact. The switch contact at the other end has a rear contact section formed in the card thickness-parallel direction and defines a second switch contact in confronting relation with the first contact. Insertion of the card in the card socket causes the first switch contact to move in the card width-parallel plane toward the second switch contact in the card thickness-parallel direction so that the second contact is contacted and wiped by the first contact.

5 Claims, 13 Drawing Sheets

PRIOR ART ures of this invention which are believed to be
DETECTION SWITCH MOUNTED IN A CARD SOCKET

FIELD OF THE INVENTION

The present invention relates to a card socket for receiving a card-like medium such as a memory card or SD card, and more particularly to a detection switch mounted in a card socket for detecting the presence of a card and/or preventing write-access to the card.

BACKGROUND OF THE INVENTION

A conventional card socket includes a card-receiving space for receiving a card such as a memory or SD card, and a detection switch to detect the presence or insertion of the card. Such a detection switch comprises contact members responsive to insertion of the card into the card-receiving space.

FIG. 14 shows a conventional card socket for such cards. As shown, a card 101 is inserted in a card-receiving space 102 of a socket housing 100, which has first, second and third contact pieces 103, 104 and 105 mounted at one longitudinal side of the housing. First and third contact pieces 103 and 105 are adapted to be deflected during insertion of card 101. Second and third contact pieces 104 and 105 constitute a first switch used for detecting the presence of a card, for example, and first and second contact pieces 103 and 104 constitute a second switch used for a second function such as write protect. In this second function, card 101 includes a movable piece 106 at one longitudinal side thereof, and the deflection of first contact piece 103 of the write protect detection switch is controlled due to the position of movable piece 106 on card 101.

Another example of a detection switch is shown in Japan Patent Laid Open No. 11-97110 and includes a contact member responsive to insertion of a card for moving in a direction parallel to the thickness of the card until it contacts a mating switch contact. Still another example of a detection switch includes a contact member responsive to the insertion of a card by wiping the mating switch contact (see Japan Patent No. 2973402).

The contact members of a detection switch are likely to collect particles of foreign substance or to have oxide coating formed thereon, thus contributing to unstable switching conditions—particularly in a detection switch that does not include wiping action such as that shown in the conventional switch of FIG. 11.

Furthermore, a conventional detection switch uses contact members of different shapes and sizes which require multiple stamping dies and multiple parts to make up a detection switch. This contributes to the overall relatively high manufacturing, assembly and inventory costs and does not allow for the effective reduction of costs for sockets equipped with switches. For example, the detection switch of FIG. 11 uses three different kinds of contact members, and another conventional detection switch uses two different kinds of contact members. Two detection switches if combined, need to use three different kinds of contact members. This type of design is not necessarily cost effective or simple.

SUMMARY OF THE INVENTION

Therefore, one object of the present invention is to provide a detection switch for a card socket which assures that the switching action is stable and includes contacts which utilize a wiping action to ensure such stability.

Another object of the present invention is to provide a detection switch for a card socket using contact members of the same design, accordingly permitting the reduction of manufacturing costs.

To attain these objects, a contact member is so designed according to the present invention that it includes contact sections formed on its opposite ends, one adapted to move in the card width-parallel plane and be contacted by the front end of a card when being inserted in the card-receiving space, and the other adapted to move in the card thickness-parallel direction.

Specifically, a detection switch is mounted in the card-receiving space of a card socket and includes contact members responsive to insertion of a card into the card-receiving space and includes two or more contact members, each having contact sections formed on opposite ends thereof, the contact section at one end having a front contact formed in the card width-parallel plane in which the card is contained when being inserted in the card-receiving space, the front contact defining a first switch contact formed on one side, and the contact section of the other end having a rear contact formed in the card thickness-parallel direction, the rear contact section defining a second switch formed on one side thereof in confronting relation with the first switch contact whereby insertion of the card into the card-receiving space causes the first switch contact to move in the card width-parallel plane and deflect the second switch contact in the card thickness-parallel direction.

A single detection switch can be made up by arranging two contact members in series with the first contact of one of the contact members positioned adjacent to the second contact of the other contact member, thereby allowing the first contact to wipe the second contact upon insertion of a card into the card socket. A series of two detection switches can be made up by arranging three contact members in series with the first contact piece of the head contact member cut and removed, and with the second contact piece of the tail contact member cut and removed. Each of the contact members are of the same design, which has the first contact formed on one end and the second contact formed on the other end. Such a contact member may be made in a single stamping die by stamping and forming a thin metal sheet or by pressing a circular, elliptical, triangular or square metal rod into the required shape.

In use, when a card is inserted in the card socket, the front end of the card abuts the front contact section of one contact member, moving it in the card width-parallel plane until the first contact has reached the second contact of the rear contact section of the other contact member. Further insertion of the card in the card socket moves the second contact in the card thickness-parallel direction, allowing the first contact to wipe the second contact.

Other objects and advantages of the present invention will be understood from the following description of an electric connector assembly according to a preferred embodiment of the invention in conjunction with the accompanying drawings.

Other objects, features and advantages of the invention will be apparent from the following detailed description taken in connection with the accompanying drawings.

BRIEF DESCRIPTION OF THE ACCOMPANYING DRAWINGS

The features of this invention which are believed to be novel are set forth with particularity in the appended claims. The invention, together with its objects and the advantages thereof, may be best understood by reference to the following description taken in conjunction with the accompanying drawings, win which like reference numerals identify like elements in the Figures and in which:

DESCRIPTION OF THE PREFERRED EMBODIMENTS

Figure 1:
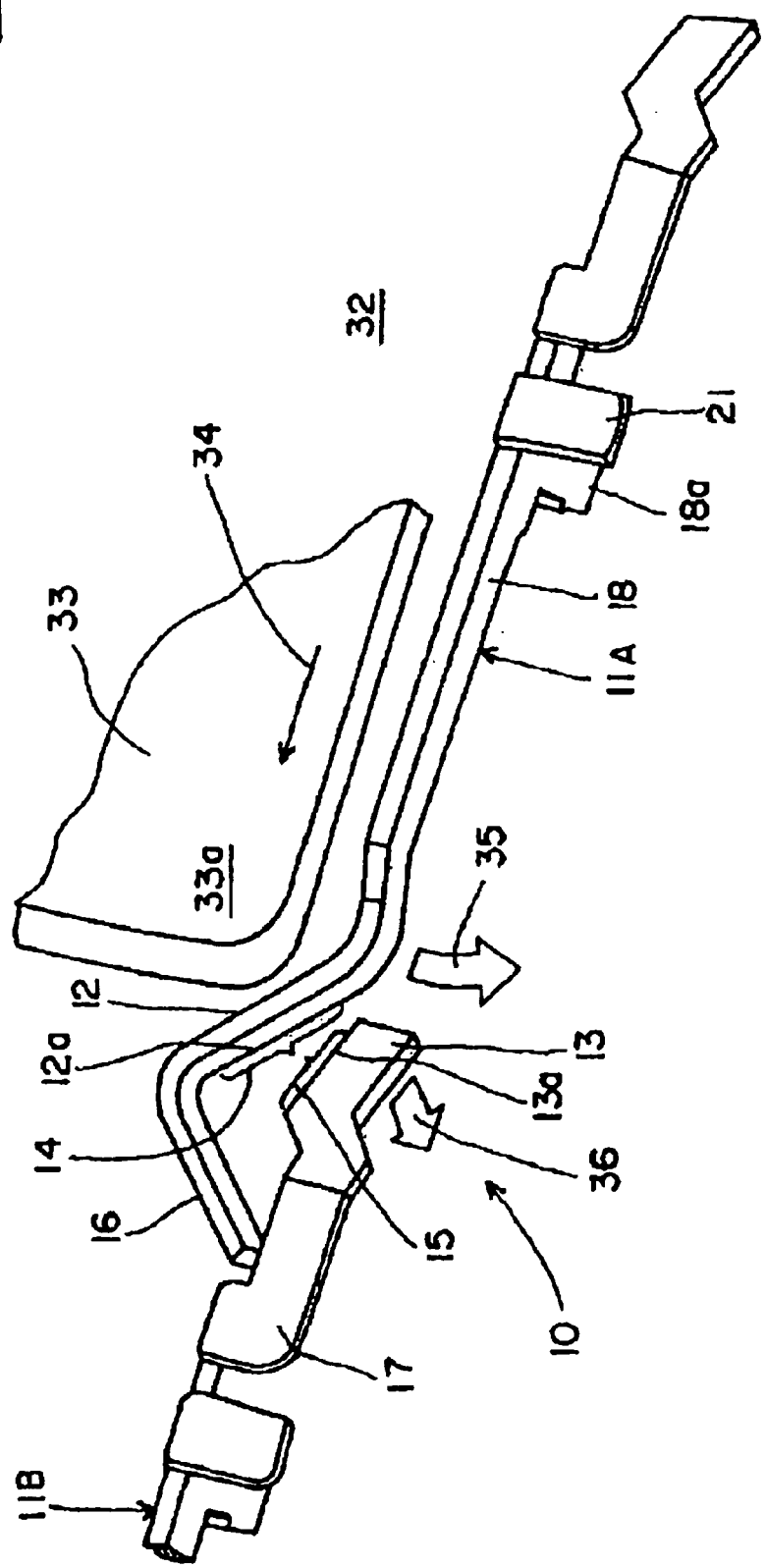
FIG. 1 is an enlarged perspective view of contact members which make up a detection switch according to a first embodiment of the invention.

FIG. 1 shows a detection switch 10, according to a first embodiment of the invention, removed from a housing 31 of a card socket 30. A card medium 33 such as a memory, IC or SD card is inserted into a card-receiving space 32 of a card-receiving socket 30 in a direction indicated by arrow 34 and detection switch 10 is arranged on one longitudinal side of the housing in the same direction as the insertion of the card (see FIG. 4). A first embodiment of detection switch 10 comprises two contact members 11A and 11B responsive to insertion of card 33 into card-receiving space 32 as described hereinafter.

Figure 2:
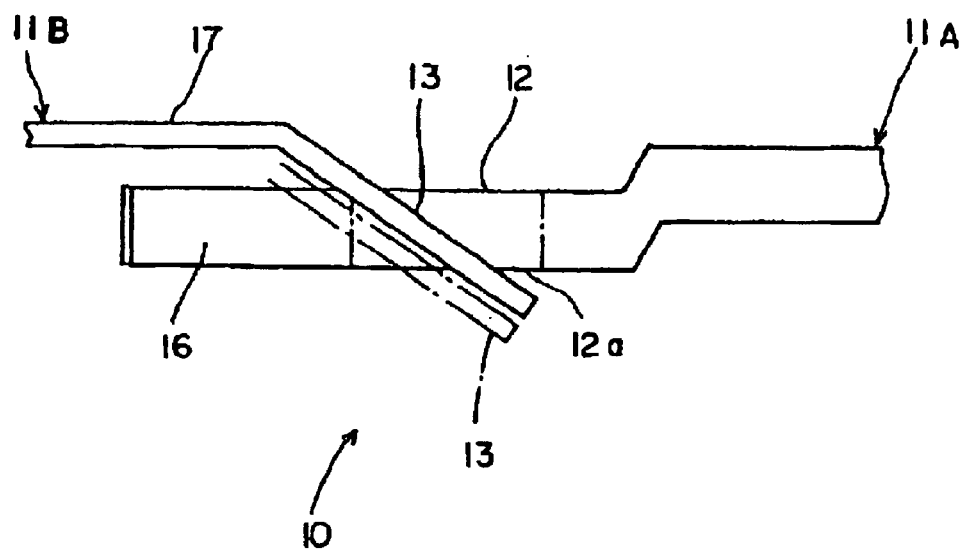
FIG. 2 is an enlarged side view of the detection switch shown in FIG. 1.

FIG. 1 shows an enlarged view of contact members 11A and 11B arranged in series with a front contact section of following contact member 11A overlapping a rear contact section of leading contact member 111B in the card-inserting direction as indicated by arrow 34. The front contact section of following contact member 11A is formed into a "V"-shape in the card width-parallel plane in which card 33 is contained, so that an up-slope 12 of the "V"-shape confronts the front end of card 33 upon insertion of a card. As shown in FIG. 2, the rear contact section of leading contact member 11B is formed in the card thickness-parallel direction and includes an including flat surface 13 formed downwardly from a flat planar surface 17.

Still referring to FIG. 2, a portion of inclined flat surface 13 of rear contact section of contact member 11B is coplanar with up-slope 12 of the front contact section of contact member 11A in the card width-parallel plane, leaving a gap between a lower side 12a of up-slope 12 and counter side 13a of inclined flat surface 13. Thus, lower side 12a of up-slope 12 and counter side 13a of inclined flat surface 13 provide a first switch contact 14 and a second switch contact 15 of detection switch 10. During actuation of the switch, down-slope 16 which is contiguous with up-slope 12 of the "V"-shaped contact piece is accommodated under flat surface 17 which is contiguous with inclined flat surface 13.

Again referring to FIG. 1, when card 33 is inserted into socket housing 31 in the direction indicated by arrow 34, a corner 33a of the front end of card 33 abuts up-slope 12 of following contact member 11A so that the "V"-shaped contact section is displaced outwardly as indicated by arrow 35 and first contact 14 contacts second contact 15. Thus, the "normally-open"detection switch 10 is closed and turns "on", detecting insertion of card 33.

Further insertion of card 33 into socket 30 causes slope 12 to move in the direction of arrow 35, applying a force to inclined surface 13 in the card thickness-parallel direction as indicated by arrow 36 and, at the same time, wiping inclined flat surface 13 with first contact 14 to remove foreign particles and/or oxide coatings. Thus, a stable switching function is assured.

Figure 3:
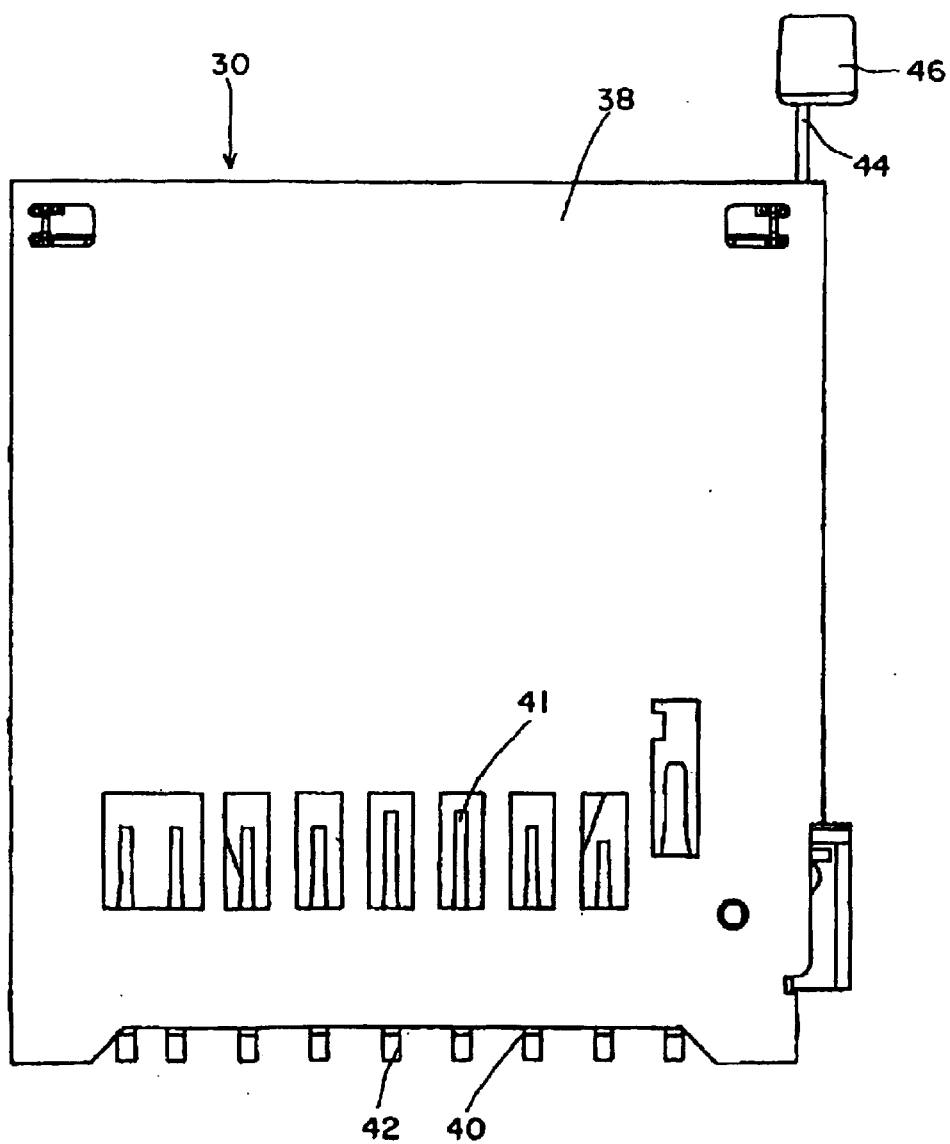
FIG. 3 is a plan view of a card socket equipped with a detection switch according to the present invention.
Figure 4:
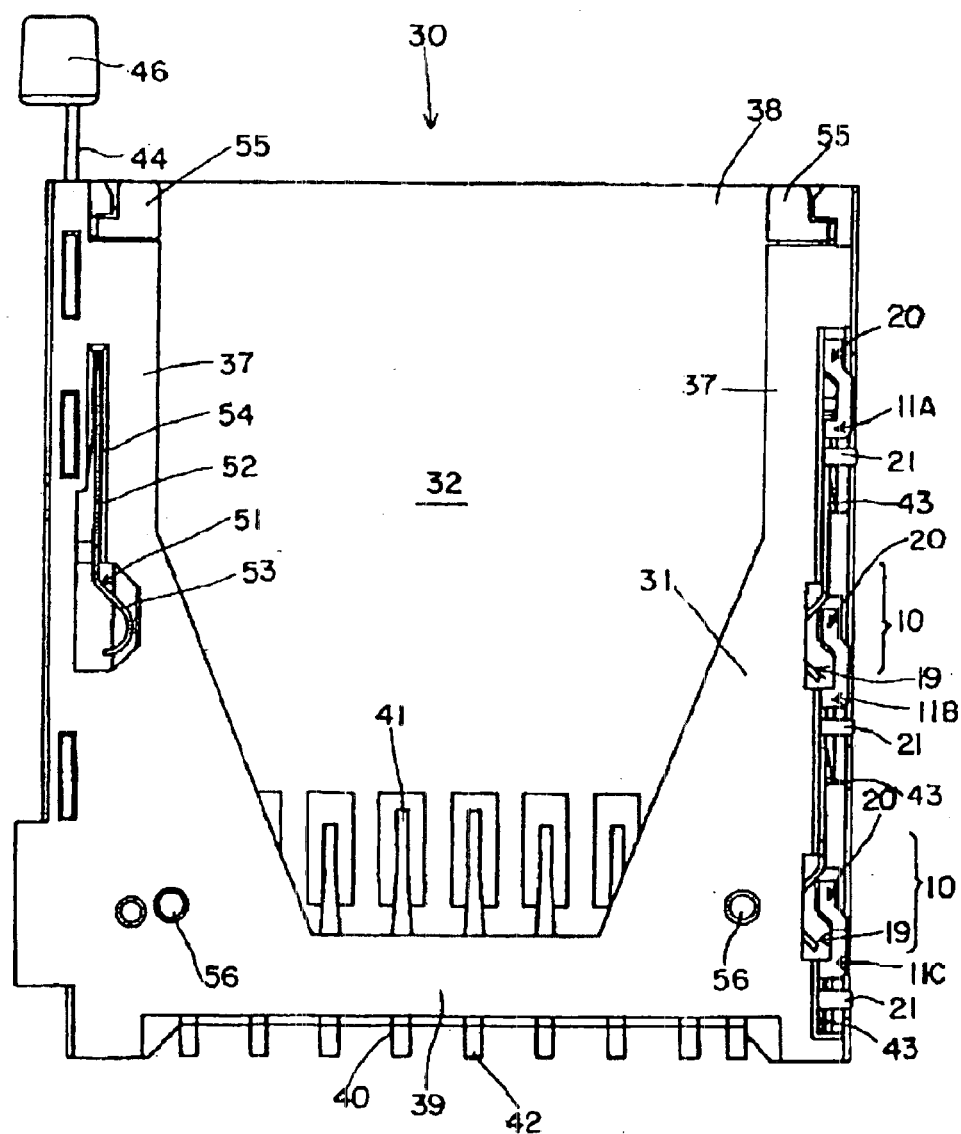
FIG. 4 is a bottom view of the card socket.
Figure 5:
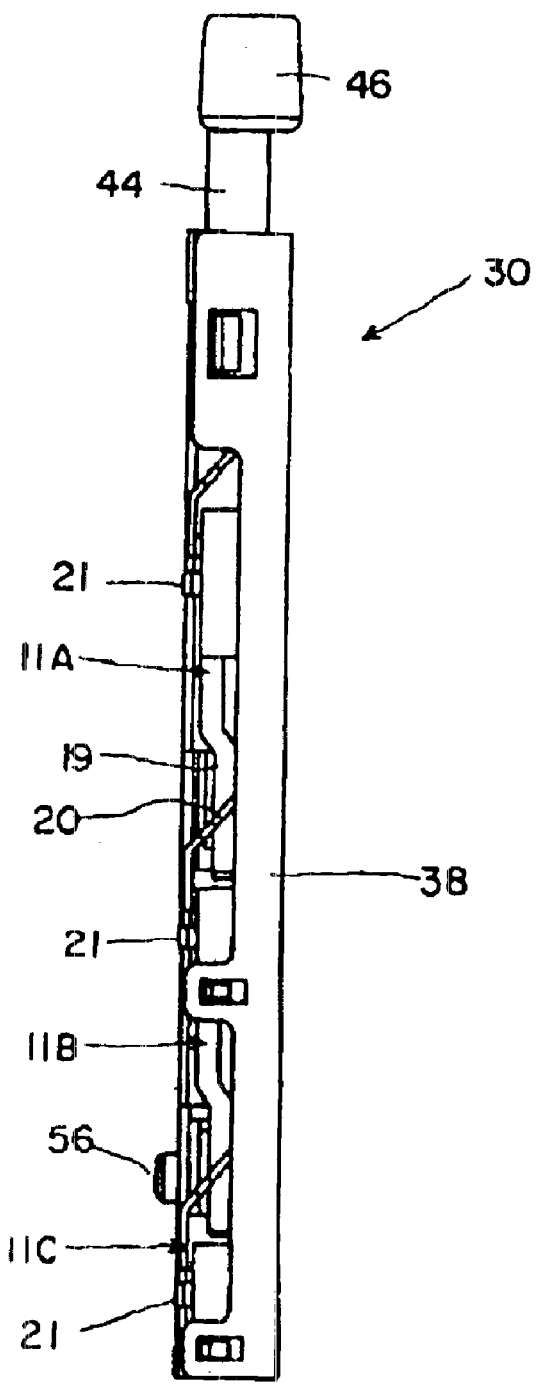
FIG. 5 is a left side view of the card socket.
Figure 6:
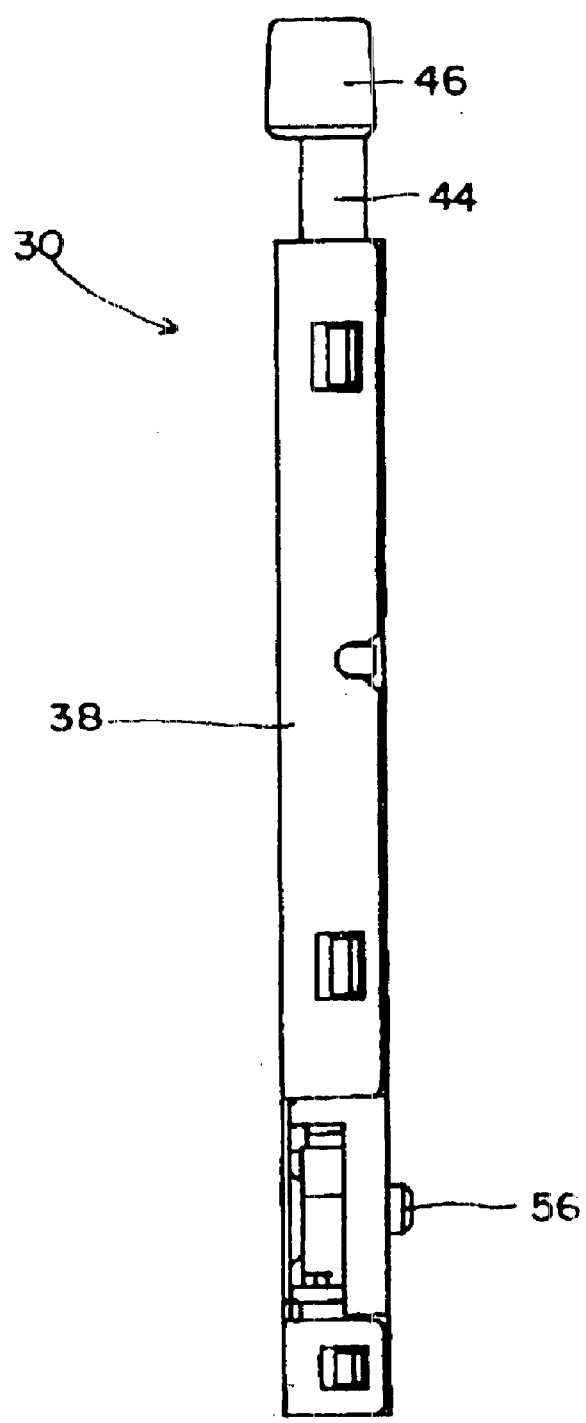
FIG. 6 is a right side view of the card socket.
Figure 7:
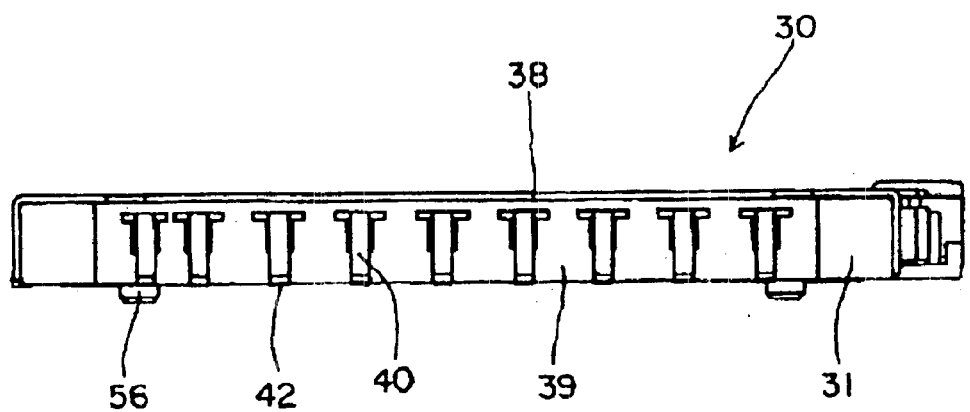
FIG. 7 is a rear view of the card socket.
Figure 8:
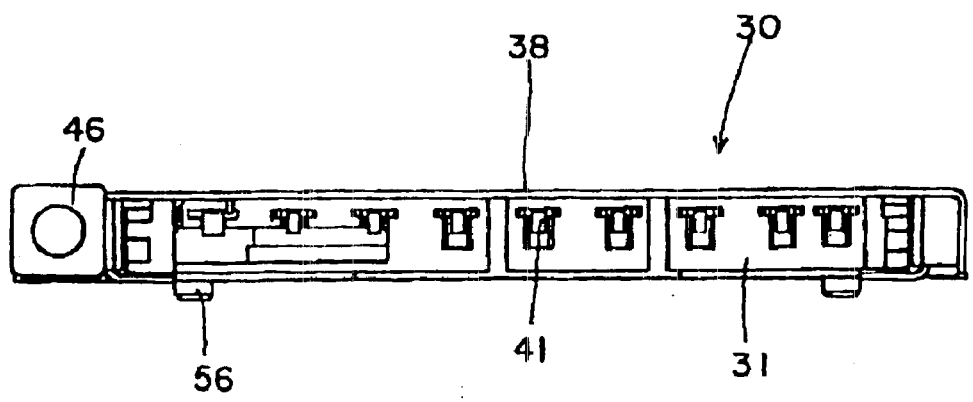
FIG. 8 is a front view of the card socket.
Figure 9:
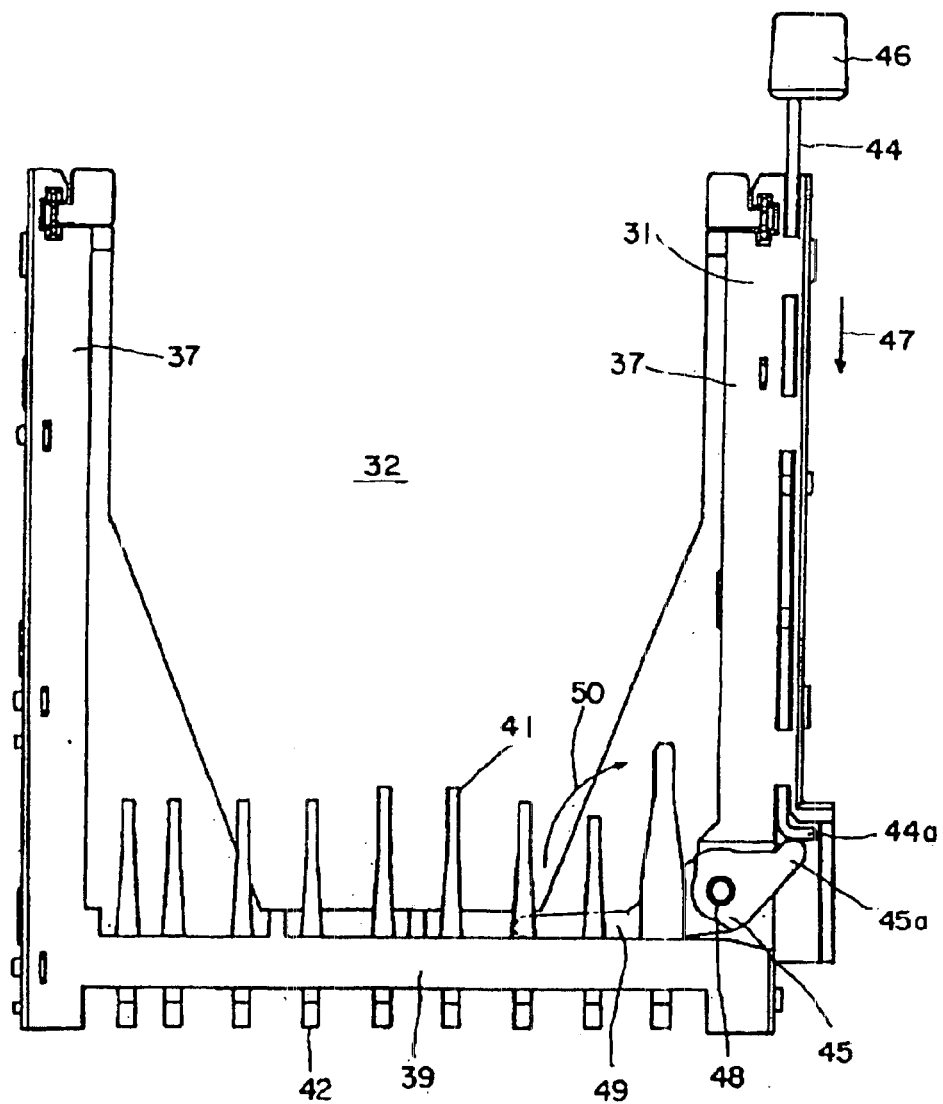
FIG. 9 is a plan view of the card socket with its metal shield removed.

Referring to FIG. 3 and subsequent drawings, a card socket 30 equipped with a detection switch assembly according to the present invention has an insulating plastic housing 31, which has a "U"-shape as best seen in FIGS. 4 and 9. "U"-shaped housing 31 has a card-receiving space 32 between its opposite side pieces 37 for receiving card 33. Card-receiving space 32 is covered by a metal shell 38, which is mounted to card housing 31.

A lateral end piece 39 integrally connects opposite side pieces 37 and defines the end of card receiving space 32. Lateral end piece 39 has a plurality of terminals 40 passing therethrough, each terminal 40 having a contact piece 41 extending into card receiving space 32 and adapted to make mechanical and electrical contact with a corresponding contact (not shown) in card 33. Also, each terminal 40 has a tail piece 42 extending outside of lateral end piece 39 for soldering to a corresponding conductor pad on an underlying printed circuit substrate.

As shown in FIG. 4, a further embodiment of a detection switch assembly is shown. This detection switch assembly is mounted in socket housing 31 along its right longitudinal side piece 37 (as viewed in FIG. 4). The detection switch assembly includes three similar contact members 11A, 11B and 11C arranged in series, each having two different switch contacts formed on its opposite ends. One detection switch 10 is composed of following contact member 11A and the intermediate contact member 11B, and another detection switch 10 is composed of leading contact member 11C and intermediate contact member 11B.

Figure 10:
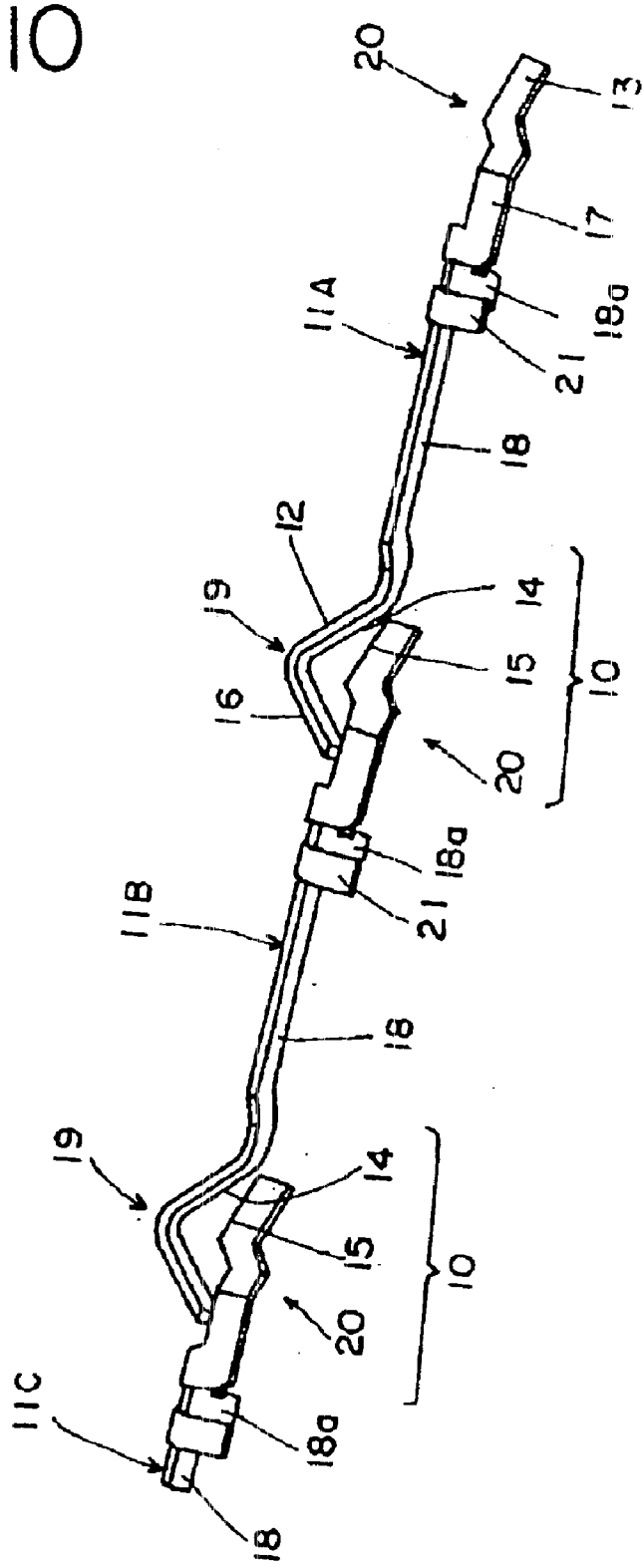
FIG. 10 is a perspective view of the three contact members which make up two detection switches.

Referring to FIG. 10, each contact member is made from a stamped and formed metal sheet having a "V"-shaped front contact section 19 at one end, and a ramp-shaped rear contact section 20 at an opposite end as described above with respect to the contacts shown in FIG. 1. Specifically, front contact section 19 is composed of contiguous up and down slopes 112 and 16 and rear contact section 20 is composed of contiguous flat and down slope 17 and up and down slope 13. Leading contact member 11C has a rear contact section only—there is no front contact section.

As in the two-contact switch embodiment, contact members 11A, 11B and 11C are arranged in-line and mounted in longitudinal side piece 37 by inserting their shanks 18 into longitudinal slot 43 and by locating engagement pieces 18a in the side of the housing (see FIG. 10). Front contact sections 19 of contact members 11A and 11B project inwardly into card space 32, thereby permitting them to move outwardly by front end 33a of card 33 when the card is inserted into card space 32. Also, rear contact sections 20 of contact members 11B and 11C confront front contact sections 19, thereby causing them to move downwardly by slope 12 when card 33 is inserted in card space 32. Thus, two detection switches 10 are provided.

Shank 18 of each contact member has a tail portion 21 extending perpendicular to its length. Tail portion 21 is coplanar with the bottom of housing 31 when the contact member is mounted in the housing, and tail portion 21 can therefore be soldered to a corresponding pad of a printed circuit substrate (not shown).

When card 33 is inserted into socket 30, front end 33a of card 33 abuts contact section 19 of contact member 11A so that second contact 15 of contact section 20 of contact member 11B is wiped by first contact 14 of contact section 19 of contact member 11A. Thus, normally-open detection switch 10 is now closed.

Further insertion of card 33 in socket housing 31 causes contact section 19 of contact member 11B to move in the card width-parallel direction, wiping second contact 15 of contact section 20 of contact member 11C with first contact 14 of contact section 19 of contact member 11B. Again, the second normally-open detection switch is now closed.

Thus, two detection switches can be actuated sequentially by card 33. These detection switches have contact member 11B in common. One of the detection switches is composed of contact member 11B and contact member 11C, and is used to detect the presence of a card in a socket. The other detection switch is composed of contact member 11A and contact member 11B, and can be used to prevent write access to a card for example. For that purpose, front contact section 19 of contact member 11A may be so positioned that it confronts a movable piece 106 of card 33 (FIG. 11) when the card is inserted in the card socket.

In the assembly, regardless of how many detection switches are used or made, each can be made of contact members of the same design using the same stamping die and arranged in series, accordingly, manufacturing costs can be reduced relative to conventional detection switches each made of different parts. The first and last contacts in the series are selectively modified so as to remove the portion of the contact members that are not used as part of the switch. For example, contact member 11C is modified by removing front contact section 19. Likewise, contact member 11A is reduced in length by removing rear contact section 20. Obviously this would contributes to the overall down-sizing of card socket 30.

Socket housing 31 may also include a card ejecting mechanism and a card retaining mechanism fixed to the other longitudinal side piece 37 (i.e. the left side in FIG. 4).

As seen in FIG. 9, the card ejecting mechanism is composed of an ejection rod 44 movably fixed to longitudinal side piece 37 and an ejection lever 45 rotatably fixed to the corner whereat longitudinal side piece 37 and lateral end piece 39 are integrally connected. Ejection rod 44 has a push-button 46 at its end and moves slidingly inwardly within longitudinal side piece 37 of socket housing 31 when a force is applied to push-button 46.

As seen in FIG. 9, rotary ejection lever 45 pivots at its center 48 with a projection end 45a confronting an ejection end 44a of ejection rod 44 and with an elongated arm 49 extending generally along lateral end piece 39. When ejection rod 44 moves inwardly in longitudinal side piece 37, rotary ejection lever 45 rotates clockwise as indicated by arrow 50 to eject card 33 from the card socket.

Referring to FIG. 4, the card retaining mechanism may include a resilient member 51 stamped and formed from a thin metal sheet. Specifically, resilient member 51 comprises a straight portion 52 and a curved portion 53 integrally connected thereto. Resilient member 51 is mounted in longitudinal side piece 37 of socket housing 31 by mounting straight portion 52 in longitudinal slot 54 and allowing curved portion 53 to project into card-receiving space 32 of card socket 30. Card 33 has a recess or notch (not shown) formed on one longitudinal side thereof, and card 33 can be held positively in the card socket by allowing curved portion 53 of resilient member 51 to snap into the recess of card 33. Thus, card 33 can be inserted in the card socket with an audible "click".

Also shown in FIG. 4, the card socket may include opposite metal fitting nails 55 and opposite positioning posts 56 fixed to its bottom. Metal fitting nails 55 are attached to ends of opposite longitudinal side pieces 37 and are flush with the bottom of the card socket. These metal fitting nails 55 are adapted to be soldered to corresponding solder pads of an underlying printed circuit substrate (not shown). Positioning posts 56 are integrally formed on the bottom of the socket housing by molding, and are adapted to be received in corresponding positioning holes in the printed circuit substrate. Thus, the card socket can be positioned accurately on the printed circuit substrate.

Figure 11:
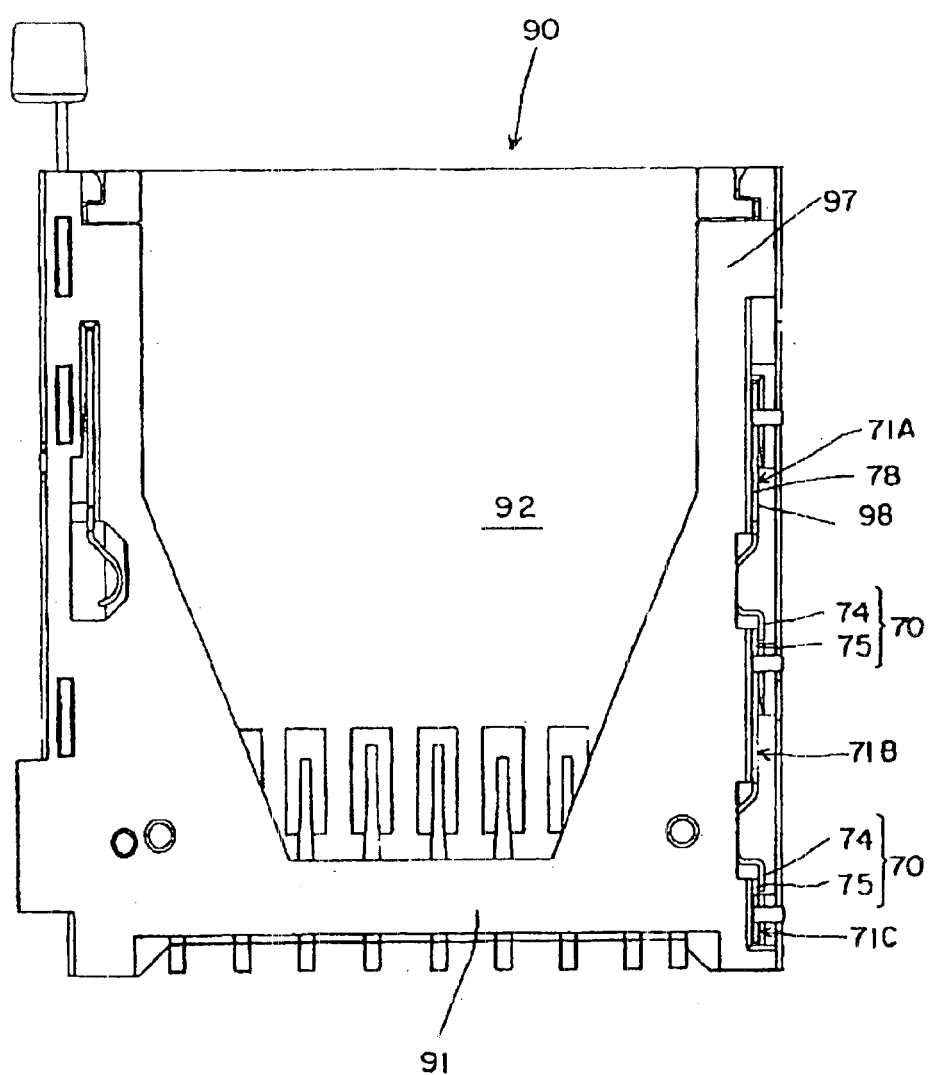
FIG. 11 is a bottom view of a second embodiment of the invention showing a normally-closed switch configuration.
Figure 12:
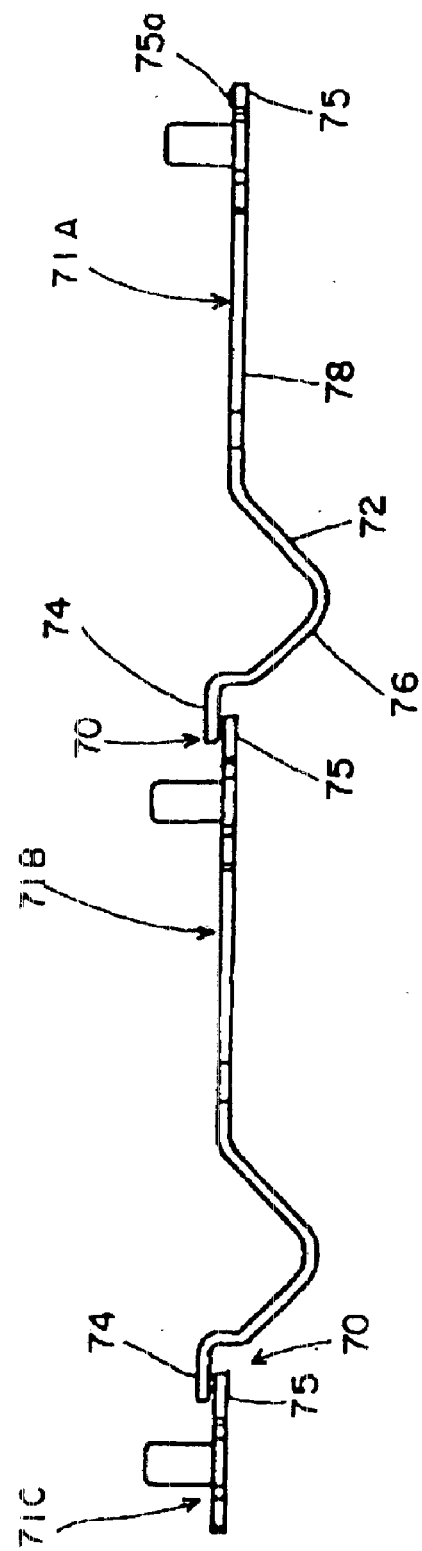
FIG. 12 is a plan view of the detection switch of FIG. 11.
Figure 13:
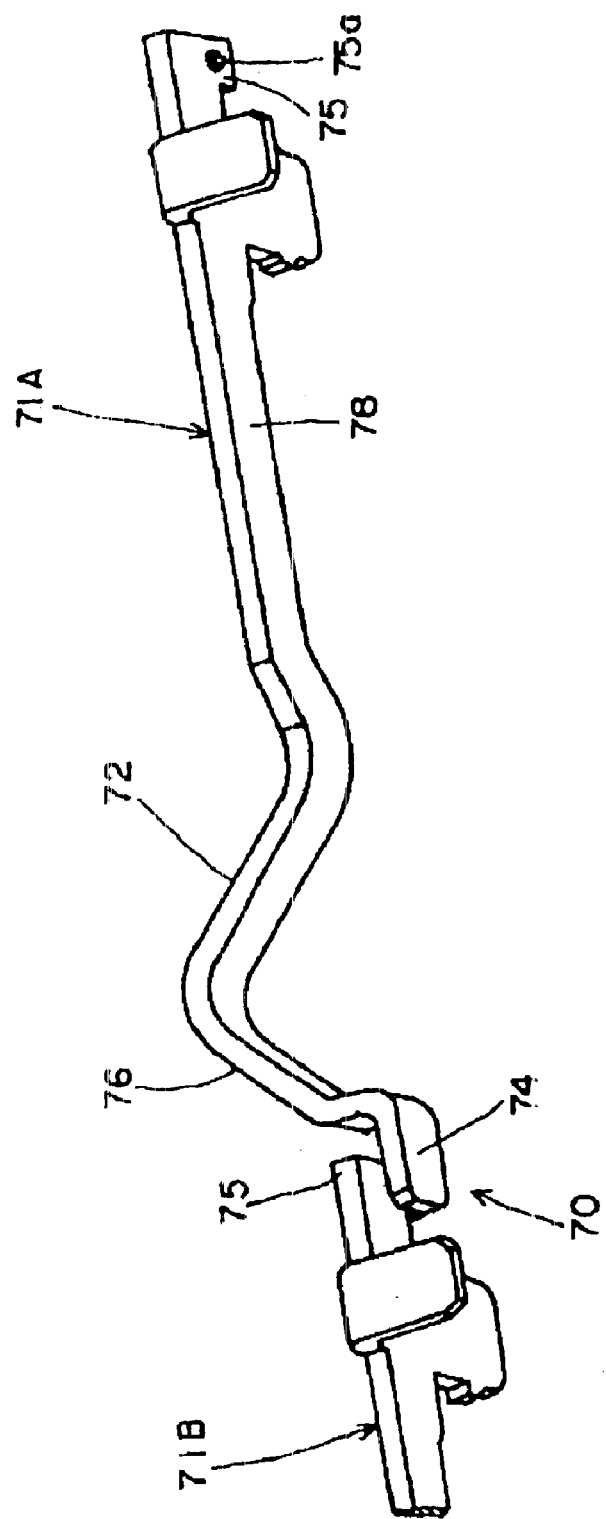
FIG. 13 is an enlarged perspective view of two contact members of the second embodiment of the detection switch shown in FIGS. 11 and 12.
Figure 14:
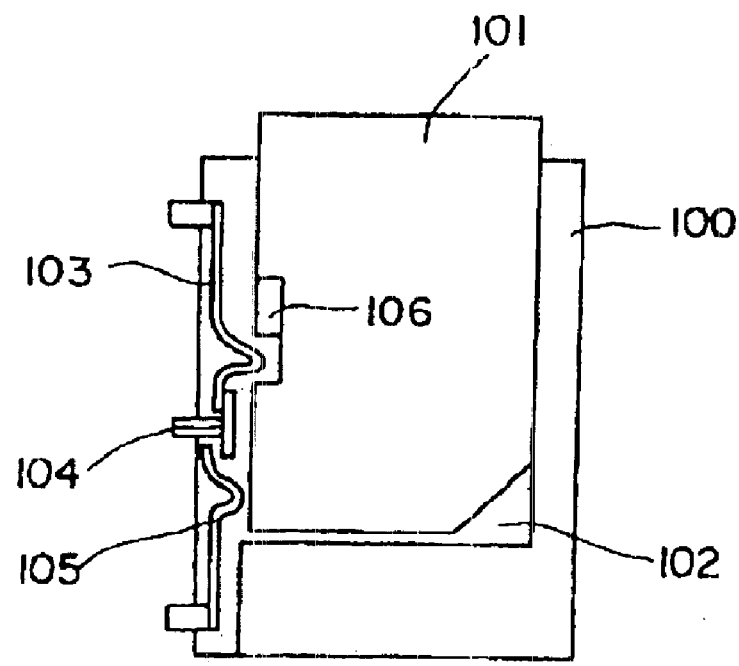
FIG. 14 illustrates a card socket equipped with a conventional detection switch.

A third embodiment of the detection switch is shown in FIGS. 11 through 13. A card socket 90 has three contact members 71A, 71B and 71C arranged in series on one longitudinal side of "U"-shaped housing 91. A first detection switch 70 is made by the contact members 71A and 71B, and a second detection switch 70 is made by contact members 71B and 71C.

As in the first embodiment, each contact member is made by stamping and forming a thin metal sheet into the configuration shown in FIGS. 12 and 13. Specifically, each contact comprises a shank 78 having a front or head contact and a rear or tail contact integrally connected thereto. The head contact comprises up and down slopes 72 and 76 that form a "V" shaped contact in the card-width parallel plane, and a first planar contact 74 integrally connected to the end of down slope 76. The tail contact comprises a second planar contact 75 integrally connected to the end of shank 78, and includes a contact projection 75a formed on one side thereof (see FIG. 13).

The shanks 78 of contact members 71A, 71B and 71C are mounted in longitudinal housing slot 98 of housing 91 with their "V" shaped head contacts projecting into card-receiving space 92. During its undeflected state, first planar contact 74 of contact member 71A abuts second contact 75 of contact member 71B and first contact 74 of contact member 71B abuts second contact 75 of contact member 71C. Accordingly, this switch is normally-closed. Note that contact member 71C does not include a shank or first planar contact.

When a card medium such as an SD card is inserted into card-receiving space 92, it contacts slope 72 of the head contact of contact member 71A and moves first contact 74 of contact member 71A away from second contact 75 of contact member 71B. Thus this normally-closed detection switch 70 is opened upon insertion of a card. When a card in further inserted into card-receiving space 92, it contacts second slope 72 of contact member 71B and moves first contact 74 of contact member 71B away from second contact 75 of contact member 71C. Again this normally-closed switch is made to open.

As in the other embodiments, these switch contacts are of the same design and regardless of the number of detection switches used, they can each be made by arranging the same terminal design in series. Accordingly, a single metal stamping die can be used, and a reduction of the cost of manufacturing can be achieved. The same design can also be used for the first and last switch contact in the series, by removing the portion of the contact that is not used in the detection switch.

It will be understood that the invention may be embodied in other specific forms without departing from the spirit of central characteristics thereof. The present examples and embodiments, therefore, are to be considered in all respects as illustrative and not restrictive, and the invention is not to be limited to the details given herein.

What is claimed is:

1. A detection switch (10) mounted in a card socket (30) for detecting the presence of a card (33) inserted into the socket, the detection switch including two contact members (11A, 11B) which comprising a first and a second contact members arranged in series along one longitudinal side of the socket, each contact member having a contact section formed on an end thereof adjacent the contact section of the other contact member, the contact section of the first contact member (11A) including a front contact formed in a card width-parallel plane and defining a first switch contact (14) adapted to be contacted by the card and deflected in the card width-parallel plane when the card is inserted into the socket, the detection switch (10) comprising the contact section of the second contact member (11B) including a rear contact formed in a card thickness-parallel direction and defining a second switch contact (15) adapted to be deflected and wiped in the card thickness-parallel direction by the first switch contact when the card is inserted into the socket, wherein the wiping action between the first and second switch contacts assures a stable switching function.

2. The detection switch according to claim 1 wherein the front contact is formed in a general "V" shape such that one side of the "V" shape is adapted to be contacted by a front edge of the card (33) upon insertion of the card into the card socket (30).

3. The detection switch according to claim 2 wherein the rear contact includes a flat planar surface (17) and an inclined flat surface (13) extending therefrom, wherein a portion of the inclined flat surface is coplanar with the one side of the "V" shape and is adapted to be deflected by the one side of the "V" shape during insertion of the card into the card socket.

4. The detection switch according to claim 3 wherein during deflection of the second switch contact (15) by the first switch contact (14), the other side of the "V" shape of the front contact is accommodated under the flat planar surface (17) of the rear contact.

5. A detection switch according to claim 1 wherein the switch contacts are spaced apart from one another in their undetected state thereby comprising a normally-open detection switch and, upon insertion of the card and deflection of the first switch contact, the switch contacts contact one another thereby closing the normally-open switch.

* * * * *